United States Patent [19]

Belcher

[11] Patent Number: 5,394,113
[45] Date of Patent: Feb. 28, 1995

[54] HIGH IMPEDANCE LOW-DISTORTION LINEAR AMPLIFIER

[75] Inventor: Donald K. Belcher, W. Melbourne, Fla.

[73] Assignee: Harris Corporation, Melbourne, Fla.

[21] Appl. No.: 937,543

[22] Filed: Aug. 28, 1992

[51] Int. Cl.⁶ ............................................. H03F 3/05
[52] U.S. Cl. ..................................... 330/260; 330/85
[58] Field of Search ................. 330/260, 253, 292, 85

[56] References Cited

U.S. PATENT DOCUMENTS

| | | | |
|---|---|---|---|
| 4,155,047 | 5/1979 | Rubens et al. | 330/284 |
| 4,462,001 | 7/1984 | Girard | 330/149 |
| 4,524,331 | 6/1985 | Faith | 330/292 |
| 4,560,945 | 12/1985 | Olver | 330/149 |
| 4,564,816 | 1/1986 | Kumar et al. | 330/149 |
| 4,583,052 | 4/1986 | Ishii | 330/260 |
| 4,591,796 | 5/1986 | Muller-Girard et al. | 328/184 |
| 4,591,803 | 5/1986 | Saleh | 330/277 |
| 4,633,197 | 12/1986 | Vanderspool, II | 332/16 |
| 4,634,993 | 1/1987 | Koen | 330/260 |
| 4,703,284 | 10/1987 | Barbu | 330/260 |
| 4,714,845 | 12/1987 | Devecchi et al. | 330/260 |
| 4,752,743 | 6/1988 | Pham et al. | 330/149 |
| 4,772,855 | 9/1988 | Buoli et al. | 330/149 |
| 4,816,772 | 3/1989 | Klotz | 330/254 |
| 4,835,493 | 5/1989 | Walsh, Jr. | 332/41 |
| 4,857,865 | 8/1989 | Berman et al. | 330/304 |
| 4,878,030 | 10/1989 | Vincze | 330/149 |
| 4,916,338 | 4/1990 | Metz | 330/253 |
| 4,929,906 | 5/1990 | Voyce et al. | 330/149 |
| 4,943,783 | 7/1990 | Nojima | 330/149 |
| 4,987,378 | 1/1991 | Eggleston et al. | 330/149 |
| 5,015,965 | 5/1991 | Katz et al. | 330/149 |
| 5,072,194 | 12/1991 | Chevalier | 330/260 |
| 5,142,241 | 8/1992 | Yamamoto et al. | 330/253 |
| 5,142,243 | 8/1992 | Eddlemon | 330/260 |
| 5,146,637 | 11/1992 | Wurcer | 330/260 |
| 5,221,909 | 6/1993 | Cole | 330/260 |

*Primary Examiner*—R. A. Nelli
*Attorney, Agent, or Firm*—Charles E. Wands

[57] ABSTRACT

An amplifier circuit employs a differential amplifier having first and second differential inputs and having an output for providing an output signal which varies according to a difference between magnitudes of input signals provided at the first and second inputs, a high impedance front end which is coupled to the first input of said differential amplifier and which accepts an input voltage, and a feedback circuit which is interposed between the second input and the output of the differential amplifier so that error characteristics of the feedback circuit are substantially similar to error characteristics of the front end and signal errors introduced by the high impedance front end are canceled by signal errors provided by the feedback circuit. The differential amplifier can be an operational amplifier and the high impedance front ends and the feedback circuits can be source follower FET circuits each having an FET transistor and a resistor connected to the source terminal of said FET transistor. Drains of the source follower FET circuits can be connected at a point, and the amplifier circuit employs a capacitor coupled between the output of the differential amplifier and the point where the drains are connected and a drain resistor, coupled between a positive voltage source for the circuit and the point where the drains are connected.

12 Claims, 1 Drawing Sheet

HIGH IMPEDANCE LOW-DISTORTION LINEAR AMPLIFIER

FIELD OF THE INVENTION

This invention relates to electronic signal amplifier circuits and more particularly to electronic signal amplifier circuits employing low noise, highly linear, differential amplifiers.

BACKGROUND OF THE INVENTION

Electronic signal amplifier circuit performance is measured by a variety of parameters such as the amount of noise and the degree of linearity of the amplifier circuit. It is desirable to have a relatively low amount of noise while maintaining a relatively high amount of linearity. An amplifier circuit having relatively low amount of noise and a relatively high degree of linearity is a circuit employing an operational amplifier (op-amp) such as part no. CM409 manufactured by Comlinear Corp of Ft. Collinsville, Colo. Of course, there are many other types of amplifier circuits, using other components, which exhibit low distortion and high linearity. However, an amplifier circuit with a high impedance voltage source coupled to the CM409 op-amp would have a relatively high degree of noise due to the amount of current noise of the op-amp interacting with the source impedance.

The noise performance of all amplifiers can be described in terms of a series voltage noise and a shunt current noise at the input of the amplifier. If the source impedance becomes relatively high, then the current noise component (when multiplied by the source impedance) may result in an equivalent noise voltage that will significantly increase the noise levels at the amplifier input.

When a high source impedance must be used, the use of an FET preceding the amplifier will make a major reduction in the current noise term, thus driving the amplifier from a high impedance source without a major noise increase. However, FET devices have a disadvantage in that they can add significant amounts of distortion.

There is a need for a highly linear amplifier circuit having a relatively high input impedance and a relatively low noise.

SUMMARY OF THE INVENTION

According to the present invention, an amplifier circuit employs a differential amplifier with first and second differential inputs and with an output for providing an output signal according to a difference between magnitudes of input signals provided at said first and second inputs, a high impedance front end which is coupled to the first input of said differential amplifier and which accepts an input voltage, and a feedback circuit which is coupled between the second input and the output of said differential amplifier so that error characteristics of said front end are substantially similar to error characteristics of said feedback circuit and signal errors introduced by said high impedance front end are canceled by signal errors provided by said feedback circuit.

In an exemplary embodiment of the present invention, the differential amplifier can be an operational amplifier and the high impedance front and the feedback circuits can be source follower FET circuits. Drains of the source follower FET circuits can be connected at a point, and the amplifier circuit can further employ a capacitor interposed between the output of the differential amplifier and the point where the drains are connected and a drain resistor, coupled between a positive voltage source for the circuit and the point where the drains are connected.

According further to the present invention, an amplifier circuit comprises a differential amplifier, with first and second differential inputs and an output for providing an output signal according to a difference between magnitudes of input signals provided at the first and second inputs, a high impedance front end, coupled to the first input of the differential amplifier, for accepting an input voltage, a voltage divider comprising a pair of resistors connected in series and coupled between the output of the differential amplifier and a reference voltage, and a feedback circuit, coupled between the second input of the differential amplifier and the connection point, so that error characteristics of the front end are substantially similar to error characteristics of the feedback circuit and signal errors introduced by the high impedance front end are canceled by signal errors provided by the feedback circuits.

According further to the present invention, an amplifier circuit comprises a differential amplifier with first and second differential inputs and an output for providing an output signal according to a difference between magnitudes of input signals provided at the first and second inputs, a high impedance front end, coupled to the first input of said differential amplifier, for accepting an input voltage, a voltage divider comprising a pair of resistors, connected in series and coupled between said output of said differential amplifier and a reference voltage, a second differential amplifier, having first and second inputs and having an output coupled to the first input, wherein the second input is coupled to the voltage divider, and a feedback circuit is coupled between the second input of the first differential amplifier and the output of the second differential amplifier, so that error characteristics of the front end are substantially similar to error characteristics of the feedback circuit and signal errors introduced by the high impedance front end are canceled by signal errors provided by the feedback circuit.

An advantage of the present invention is its relatively high input impedance and high degree of linearity with a relatively low amount of noise. Using an FET source follower circuit to increase the input impedance has a minimal effect on the distortion of the circuit when a matched FET source follower circuit is used for feedback.

Other advantages and novel features of the present invention will become apparent from the following detailed description of the invention when considered in conjunction with the accompanying drawings.

DESCRIPTION OF THE PREFERRED EMBODIMENTS

Figure 1:
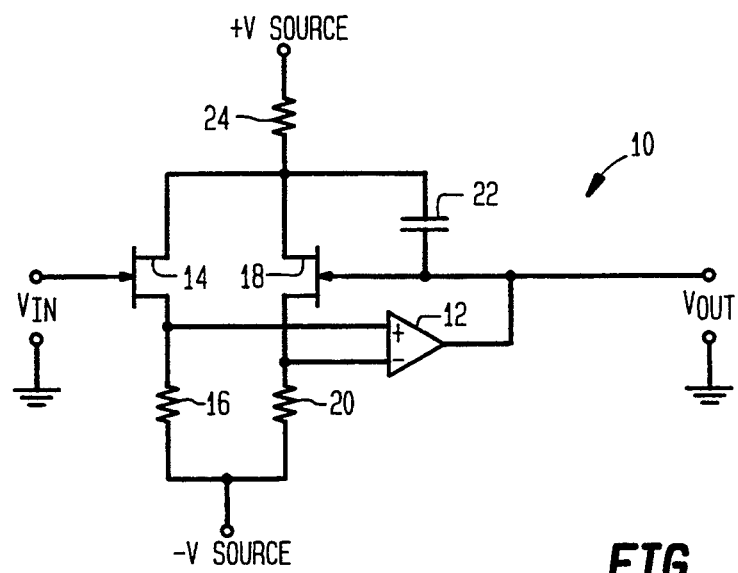
FIG. 1 is an amplifier circuit according to an embodiment of the invention.

Referring to FIG. 1, an amplifier circuit 10 is driven by an input voltage VIN and provides an output voltage VOUT. The circuit 10 uses a low distortion operational amplifier 12 ("op-amp") having two differential inputs and a low impedance output. The op-amp 12 has a relatively high bandwidth and high degree of linearity. The operational amplifier 12 can be provided by part no. CM409 manufactured by Comlinear Corp of Ft. Collinsville, Colo. However, other suitable, highly linear low distortion differential amplifiers may be used instead, including differential amplifiers having a higher input impedance.

Input voltage to the amplifier circuit 10 is not provided directly to the op-amp 12. Instead, a first FET 14 and a first resistor 16 form a first source follower circuit which is used as a high impedance front end for the input voltage, VIN. The first FET 14 and the resistor 16 can drive the low impedance first differential input (the "+" input) of the op-amp 12 while providing a high impedance input for the VIN voltage source (not shown). The resistance of the resistor 16 is nominally 500 ohms, although it will be appreciated by one skilled in the art that the invention may be practiced wherein the resistor 16 has a different resistance.

Although providing a high impedance front end for the amplifier circuit 10, the FET 14 and the resistor 16 induce signal errors in the form of signal non-linearity. Compensation for the signal errors is provided by a second FET 18 and a second resistor 20 which form a second source follower circuit coupled between the output of the op-amp 12 and the second differential input of the op-amp 12. If the FET's 14, 18 have similar performance characteristics, and the resistors 16, 20 have the same resistance, then the second source follower circuit 18, 20 distorts the feedback signal to the op-amp 12 in the same manner that the front end circuit 14 and the resistor 16 distort the input signal. Since the feedback circuit and the front end circuit are provided at the separate differential inputs to the op-amp 12, the signal errors induced by the first and second FET's 14, 18 cancel to provided a relatively linear output voltage, VOUT.

The performance characteristic of the first FET 14 should be as identical as possible to the performance characteristic of the second FET 18 in order to provide effective error cancellation. This can be accomplished by using a pair of FET's that are on the same IC chip or by using a matched pair of FET's.

It will be appreciated by one skilled in the art that other types of high input impedance/low output impedance circuits can be used instead of the FET source follower circuits illustrated herein.

In the embodiment of the amplifier circuit 10 of FIG. 1, the drains of the FET's 14, 18 are connected at a point and a capacitor 22 and a drain resistor 24 are included. The capacitor 22 is coupled between the output voltage signal, VOUT, and the point at which the drains are connected. The drain resistor 24 is connected between a positive voltage source for the amplifier circuit 10, +V, and the drain connection point. The capacitor 22 causes the AC voltage at the drains of the FET's 14, 18 to equal the output voltage, VOUT, thereby eliminating the deleterious effect of the "Miller" capacitance internal to the FET's 14, 18. The resistance of the drain resistor 24 is nominally 500 ohms, although it will be appreciated by one skilled in the art that the invention may be practiced wherein the drain resistor 24 has a different resistance. Also, capacitance of the capacitor 22 is nominally 0.01 MF, although it will be appreciated by one skilled in the art that the invention may be practiced wherein the capacitor 22 has a different capacitance.

Figure 2:
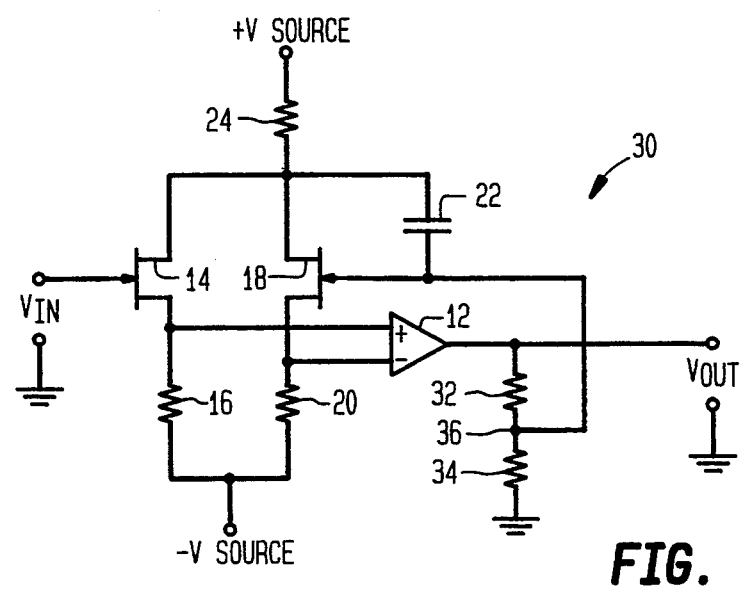
FIG. 2 is an amplifier circuit having a gain according to an embodiment of the invention.

Referring to FIG. 2, an amplifier circuit 30 with a gain greater than one is similar to the circuit 10 of FIG. 1 with the exception of two additional resistors 32, 34 which are connected in series at a connection point 36 and interposed between the output of the op-amp 12 and a reference voltage, such as ground. The resistors 32, 34 act as a voltage divider so that the voltage at the connection point 36 is a percentage of the VOUT voltage. The gate of the FET 18 is coupled to the connection point 36. Current flowing through the drain resistor 24 causes a voltage drop which affects the gain of the amplifier circuit 30. However, if the resistance of the drain resistor 24 is much greater than the resistance of the resistor 34, then the voltage at the connection point 36 is approximately equal to VIN. The gain of the system, therefore, approximately equals the sum of the resistances of the resistors 32, 34 divided by the resistance of the resistor 34. The resistance of the resistors 32, 34 is nominally 900 and 100 ohms, respectively, although it will be appreciated by one skilled in the art that the invention may be practiced wherein the resistors 32, 34 have different values of resistance, especially if a gain other than that illustrated herein is desired.

Figure 3:
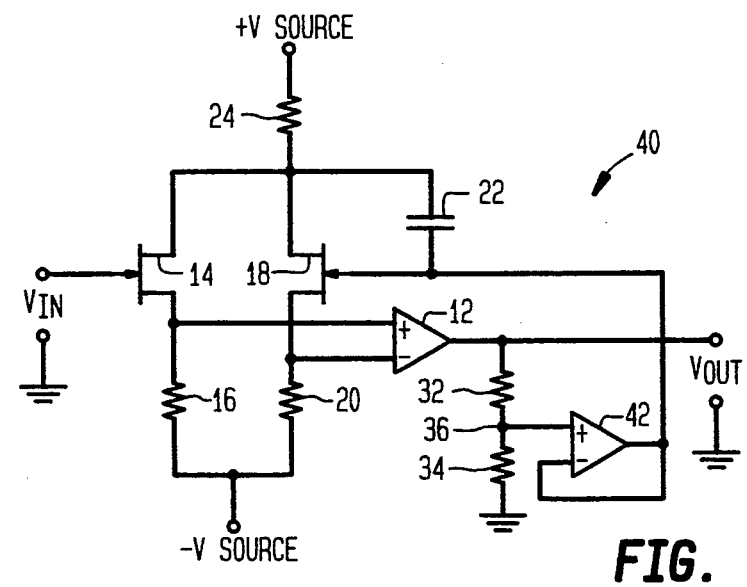
FIG. 3 is an amplifier circuit having a gain according to another embodiment of the invention.

Referring to FIG. 3, an amplifier circuit 40 is similar to the circuit 30 shown in FIG. 2 and to the circuit 10 shown in FIG. 1. In addition to the two resistors 32, 34, there is a second op-amp 42 configured as a voltage follower. One of the differential inputs of the second op-amp 42 is coupled to the connection point 36 between the resistors and the output of the second op-amp 42 is part of the feedback loop for the other op-amp 12. Using the second op-amp 42 as part of the feedback isolates the resistors 32, 34 from the effect of the source resistor 24 so that the gain of the circuit is the sum of the resistances of the resistors 32, 34 divided by the resistance 34. Unlike the circuit 30 of FIG. 2, there is no requirement for the circuit 40 that the resistance of the resistor 34 be much greater than the resistance of the drain resistor 24. The drain resistor 24 does not affect the gain of the amplifier circuit 40.

While various embodiments in accordance with the present invention have been shown and described, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed

1. An amplifier circuit, comprising:
    a differential amplifier, having first and second differential inputs, and having an output for providing an output signal which varies according to a difference between magnitudes of input signals provided at said first and second inputs;
    a high impedance front end, coupled to the first input of said differential amplifier, for accepting an input voltage;
    a voltage divider, coupled between said output of said differential amplifier and ground potential; and
    a feedback circuit, coupled between said second input of said differential amplifier and said voltage divider, wherein error characteristics of said feedback circuit are substantially similar to error characteristics of said front end, whereby signal errors introduced by said high impedance front end are canceled by signal errors provided by said feedback circuit.

2. An amplifier circuit, according to claim 1, wherein said high impedance front end and said feedback circuit are each source follower FET circuits.

3. An amplifier circuit, according to claim 2, wherein drains of said source follower FET circuits are connected at a point, and further comprising:
a capacitor coupled between said voltage divider and said point where said drains are connected; and
a source resistor, coupled between a positive voltage source for the circuit and said point where said drains are connected.

4. An amplifier circuit, according to claim 2, further comprising:
a voltage follower coupled between said voltage divider and said feedback circuit.

5. An amplifier circuit, comprising:
a differential amplifier, having first and second differential inputs, and having an output for providing an output signal which varies according to a difference between magnitudes of input signals provided at said first and second inputs;
a high impedance front end, coupled to the first input of said differential amplifier, for accepting an input voltage;
a voltage divider interposed between said output of said differential amplifier and ground potential;
a feedback circuit, interposed between said second input and said output of said differential amplifier; and
a voltage follower coupled between said voltage divider and said feedback circuit,
wherein error characteristics of said feedback circuit are substantially similar to error characteristics of said front end, whereby signal errors introduced by said high impedance front end are canceled by signal errors provided by said feedback circuit.

6. An amplifier circuit, according to claim 5, wherein said high impedance front end and said feedback circuit are source follower FET circuits.

7. An amplifier circuit, according to claim 6, wherein drains of said source follower FET circuits are connected at a point, and further comprising:
a capacitor coupled between the output of said voltage follower and said point where said drains are connected; and
a source resistor, coupled between a positive voltage source for the circuit and said point where said drains are connected.

8. An amplifier circuit comprising:
a differential amplifier having first and second differential inputs, and having an output for providing an output signal which varies according to a difference between magnitudes of first and second input signals respectively applied to said first and second inputs;
a high impedance front end and feedback circuit formed of first and second source-follower field effect transistors, respectively, having source electrodes thereof respectively connected to said first and second inputs, gate electrodes thereof coupled to receive said first and second input signals, and drain electrodes thereof coupled by way of an AC feedback path to the output of said differential amplifier.

9. An amplifier circuit according to claim 8, wherein said high impedance front end and feedback circuit includes a capacitor coupled between the output of said differential amplifier and the drain electrodes of said first and second field effect transistors.

10. An amplifier circuit according to claim 9, wherein the drain electrodes of said first and second field effect transistors and one end of said capacitor are connected to a common node and wherein said high impedance front end and feedback circuit further includes a drain resistor coupled between said common node and a source of drain bias voltage.

11. An amplifier circuit according to claim 10, further including a voltage divider coupled between the output of said differential amplifier and a second end of said capacitor.

12. An amplifier circuit according to claim 11, further including a voltage follower coupled between said voltage divider and said second end of said capacitor.

* * * * *